(12) United States Patent
Tsujiguchi

(10) Patent No.: US 6,734,760 B2
(45) Date of Patent: May 11, 2004

(54) LUMPED FILTER, SHARED ANTENNA UNIT, AND COMMUNICATION DEVICE

(75) Inventor: Tatsuya Tsujiguchi, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 46 days.

(21) Appl. No.: 10/106,382

(22) Filed: Mar. 27, 2002

(65) Prior Publication Data

US 2002/0196101 A1 Dec. 26, 2002

(30) Foreign Application Priority Data

Apr. 4, 2001 (JP) .......................... 2001-106441
Feb. 12, 2002 (JP) .......................... 2002-034374

(51) Int. Cl.$^7$ ................................ H03H 7/00
(52) U.S. Cl. .................... 333/172; 333/175; 333/185
(58) Field of Search ........................ 333/132, 134, 333/168, 175, 176, 184, 185, 219, 172

(56) References Cited

U.S. PATENT DOCUMENTS

| | | | | |
|---|---|---|---|---|
| 1,434,555 A | * | 11/1922 | Martin | ................ 333/168 |
| 4,578,654 A | * | 3/1986 | Tait | ................ 333/175 |
| 5,105,172 A | * | 4/1992 | Khatibzadeh et al. | ........ 333/175 |
| 5,173,671 A | * | 12/1992 | Wendler et al. | ............. 333/185 |
| 5,625,894 A | * | 4/1997 | Jou | ................ 455/78 |
| 6,108,569 A | * | 8/2000 | Shen | ............. 333/219 |
| 6,175,727 B1 | * | 1/2001 | Mostov | ................ 333/185 |

FOREIGN PATENT DOCUMENTS

| | | | | |
|---|---|---|---|---|
| DE | 4009076 A1 | * | 9/1991 | ........... H03H/7/01 |
| JP | 08250962 A1 | * | 9/1996 | |

* cited by examiner

*Primary Examiner*—Robert J. Pascal
*Assistant Examiner*—Dean Takaoka
(74) *Attorney, Agent, or Firm*—Keating & Bennett, LLP

(57) ABSTRACT

A lumped filter includes an input terminal, an output terminal, and a ground electrode disposed on a dielectric film on an alumina substrate. A first spiral inductor is connected between the input terminal and the ground electrode. A second spiral inductor is connected between the output terminal and the ground electrode. MIM capacitors are inserted between the input terminal and the first spiral inductor, and between the output terminal and the second spiral inductor. A third spiral inductor is inserted between the first and second spiral inductors. The spiral inductors have self-inductance, and capacitance between the spiral inductors and the electrodes adjacent thereto, by which the spiral inductors self-resonate and define as parallel LC resonators.

14 Claims, 10 Drawing Sheets

$J = 1/(\omega M)$ $J = \omega C$

NUMBER OF TURNS IN SPIRAL INDUCTOR

NUMBER OF TURNS IN INDUCTOR

WITHOUT ATTENUATION POLE — S21
WITHOUT ATTENUATION POLE — S11
WITH ATTENUATION POLE --- S21
WITH ATTENUATION POLE — S11

— S21    — S11

LUMPED FILTER, SHARED ANTENNA UNIT, AND COMMUNICATION DEVICE

BACKGROUND OF THE INVENTION

1. Field of the Invention

The present invention relates to a lumped filter having spiral inductors arranged in a circuit on a surface of a dielectric substrate, a shared antenna unit, and a communication device.

2. Description of the Related Art

A typical lumped filter is now described with reference to FIGS. 14A and 14B.

FIGS. 14A and 14B are a plan view and an equivalent circuit diagram of a lumped filter, respectively.

FIG. 14A illustrates an alumina substrate 1, an input terminal 2, an output terminal 3, a ground electrode 4, spiral inductors 5 and 6, interdigital capacitors 7 to 11, and LC resonators 12 and 13. A lower electrode, a dielectric film, and an upper electrode are laminated one on top of another on the alumina substrate 1. In FIG. 14A, the upper electrode is shown as being shaded and surrounded by solid lines, and the lower electrode is shown as being surrounded by broken lines.

FIG. 14B illustrates load conductances $G_A$ and $G_B$, parallel inductances $L_1$ and $L_2$, parallel capacitances $C_1$ and $C_2$, an input capacitance $C_{01}$, an output capacitance $C_{23}$, and a serial capacitance $C_{12}$.

The input terminal 2, the output terminal 3, and the ground electrode 4 are disposed on the dielectric film provided on the alumina substrate 1. The spiral inductor 5 having an upper electrode with a spiral configuration and the interdigital capacitor 7 are positioned side-by-side to define the LC resonator 12. The LC resonator 12 is connected between the input terminal 2 and the ground electrode 4. On the other hand, the LC resonator 13 defined by the spiral inductor 6 and the interdigital capacitor 8 is also connected between the output terminal 3 and the ground electrode 4.

The interdigital capacitor 10 is inserted between the input terminal 2 and the LC resonator 12, and the interdigital capacitor 11 is inserted between the output terminal 3 and the LC resonator 13. The interdigital capacitor 9 is inserted between the LC resonators 12 and 13.

In a circuit having such a structure, as shown in FIG. 14B, the LC resonator defined by the parallel inductance $L_1$ and the parallel capacitances $C_1$, and the LC resonator defined by the parallel inductance $L_2$ and the parallel capacitance $C_2$ are capacitively coupled through the capacitance $C_{12}$. Thus, a lumped filter is provided and includes two resonators having the input capacitance $C_{01}$ and the output capacitance $C_{23}$.

However, such a typical lumped filter has the following problems which have yet to be solved.

The lumped filter shown in FIGS. 14A and 14B includes a number of circuit elements, thereby causing the line width and line spacing which are components of each circuit element to greatly affect the characteristics of the filter. These components are equivalent to the number of interdigitations, and the line width forming an interdigitation, and the line spacing in interdigital capacitors, and equivalent to the number of turns, the line width, and the line spacing in spiral inductors. It is therefore more difficult to design the plurality of components within predetermined tolerances as the number of components increases, thereby keeping a low yield of the filter including such elements.

While predetermined transmission characteristics are achieved, in order to further increase the Q factor of the filter, a way to provide an attenuation pole at a high-frequency region or a low-frequency region of the pass-band can be contemplated. However, the typical lumped filter cannot have an attenuation pole unless a new circuit element is provided.

SUMMARY OF THE INVENTION

In order to overcome the problems described above, preferred embodiments of the present invention provide a lumped filter having a simple structure with a high band-pass characteristic, a shared antenna unit, and a communication device incorporating such a lumped filter and the antenna unit.

According to a preferred embodiment of the present invention, a lumped filter includes a dielectric ceramic substrate including a plurality of inductors, a plurality of capacitors, an input terminal, an output terminal, and a ground electrode, which are arranged to define a circuit on the dielectric ceramic substrate. A plurality of parallel elements connected between the input terminal and the ground electrode, and between the output terminal and the ground electrode include parallel LC resonators each being defined by the inductance of a spiral electrode and the capacitance produced between the spiral electrode and an adjacent electrode. A plurality of series elements inserted between the parallel elements include parallel LC resonators each being defined by the inductance of a spiral electrode and the capacitance produced between the spiral electrode and an adjacent electrode. Therefore, the lumped filter can be simple and have a high pass-band characteristic.

The number of turns, the line width and line spacing in the spiral electrode of the series element may be set at predetermined values to determine the frequency of an attenuation pole produced by the self-resonance of the parallel LC resonator. This allows an attenuation pole to be produced at a desired position, thereby providing a desired pass-band characteristic for the lumped filter.

The number of turns in the spiral electrode of the series element is preferably greater than the number of turns in the spiral electrodes of the two parallel elements adjacent to the series element. The lumped filter can thus have a simple construction while achieving a high pass-band characteristic.

At least one of the series elements inserted between the input terminal and the parallel element, and between the output terminal and the parallel element may include a capacitor defined by a lower electrode, a dielectric film, and an upper electrode disposed one after another on the dielectric ceramic substrate. Therefore, the lumped filter can be simple.

The spiral electrode may be a thin film having superconductivity. With this structure, the lumped filter can have a significantly reduced insertion loss in an environment of the transition temperature or lower. Because of substantially no conductor loss of the electrodes, the lumped filter can be compact.

In another preferred embodiment of the present invention, a shared antenna unit includes the lumped filter according to the preferred embodiment described above. Therefore, a shared antenna unit having a high attenuation characteristic in which the transmission side and the reception side provide a sufficient amount of attenuation in the mutual pass-bands can thus be constructed with simplicity.

In another preferred embodiment of the present invention, a communication device includes the lumped filter or the shared antenna unit according to the preferred embodiments described above. Therefore, a communication device having a high communication characteristic can thus be constructed with simplicity.

Other features, elements, characteristics and advantages of the present invention will become more apparent from the following detailed description of preferred embodiments with reference to the attached drawings.

DETAILED DESCRIPTION OF PREFERRED EMBODIMENTS

The structure of a lumped filter according to a first preferred embodiment of the present invention is now described with reference to FIGS. 1 to 10.

Figure 1A:
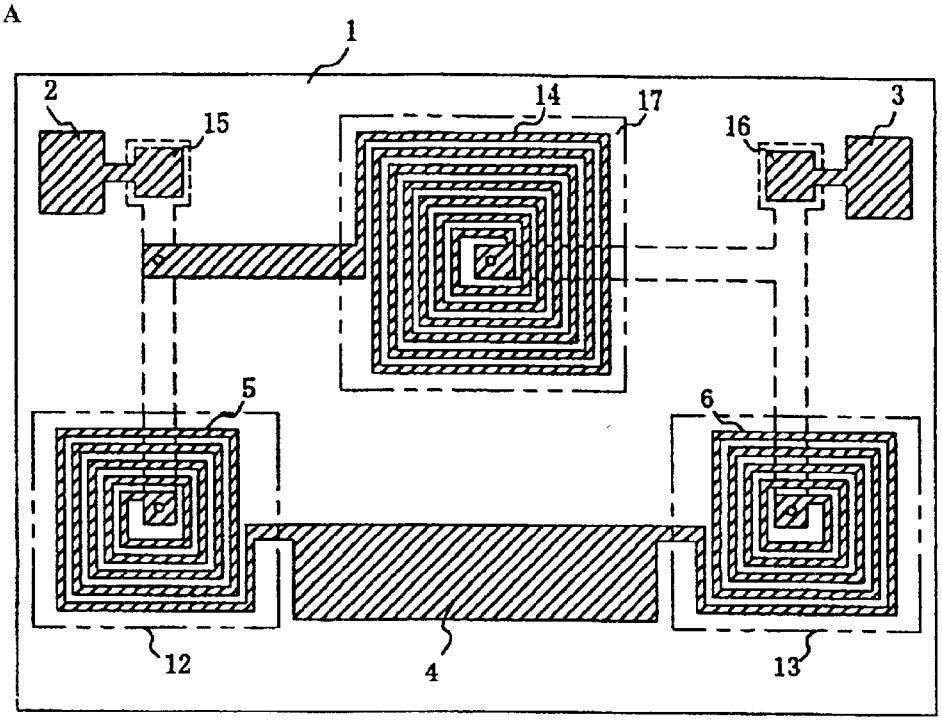
FIGS. 1A and 1B are a plan view and an equivalent circuit diagram of a lumped filter according to a first preferred embodiment of the present invention, respectively.
Figure 1B:
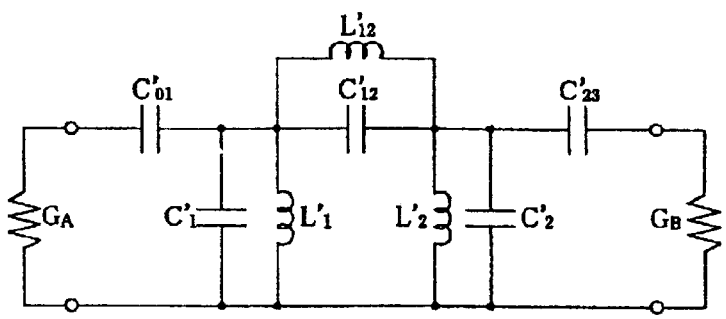

FIGS. 1A and 1B are a plan view and an equivalent circuit diagram of the lumped filter, respectively, according to a preferred embodiment of the present invention.

FIG. 1A illustrates an alumina substrate 1 which is a dielectric ceramic substrate, an input terminal 2, an output terminal 3, a ground electrode 4, spiral inductors 5, 6, and 14, capacitors 15 and 16 (hereinafter referred to as "MIM (metal-insulator-metal) capacitors") formed by laminating a lower electrode, a dielectric film, and an upper electrode one after another on the alumina substrate 1, and LC resonators 12, 13, and 17. In FIG. 1A, the upper electrode is shown as being shaded and surrounded by solid lines, and the lower electrode is shown as being surrounded by broken lines.

FIG. 1B illustrates load conductances $G_A$ and $G_B$, parallel inductances $L'_1$ and $L'_2$, parallel capacitances $C'_1$ and $C'_2$, an input capacitance $C'_{01}$, an output capacitance $C'_{23}$, and a serial inductance $L'_{12}$, and a serial capacitance $C'_{12}$.

The input terminal 2, the output terminal 3, and the ground electrode 4 are disposed on the dielectric film provided on the alumina substrate 1. The spiral inductor 5 having an upper electrode having about 4.75 turns is disposed and connected between the input terminal 2 and the ground electrode 4. On the other hand, the spiral inductor 6 having about 4.75 turns is also connected between the output terminal 3 and the ground electrode 4.

The MIM capacitor 15 is inserted between the input terminal 2 and the spiral inductor 5, and the MIM capacitor 16 is inserted between the output terminal 3 and the spiral inductor 6. The spiral inductor 14 having about 6.5 turns is further inserted between the spiral inductors 5 and 6. The spiral inductors 5, 6, and 14 each have a line-to-space (L/S) ratio of about 20 μm to about 20 μm.

The spiral inductors 5, 6, and 14 each have self-inductance, and capacitance resulting from the electrostatic capacity between the spiral inductor and the electrode adjacent thereto. Therefore, the spiral inductors 5, 6, and 14 self-resonate using a self-inductance component and a capacitance component which function as parallel LC resonators.

In the thus constructed circuit, as shown in FIG. 1B, the parallel LC resonator defined by the parallel inductance $L'_1$ and the parallel capacitances $C'_1$, and the parallel LC resonator defined by the parallel inductance $L'_2$ and the parallel capacitance $C'_2$ are capacitively coupled through the parallel LC resonator defined by the inductance $L'_{12}$ and the capacitance $C'_{12}$, thereby defining a Chebyshev filter including two resonators having the input capacitance $C'_{01}$ and the output capacitance $C'_{23}$.

Figure 2:
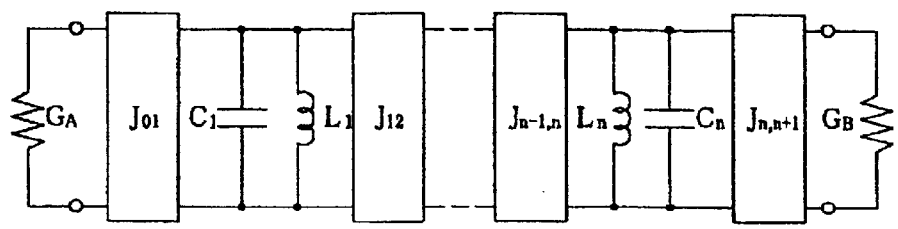
FIG. 2 is a circuit diagram of an n-stage band-pass filter including the J inverter.

Generally, an n-stage band-pass filter is expressed using the J inverter, as shown in FIG. 2.

FIG. 2 is a circuit diagram of an n-stage band-pass filter (BPF) using the J inverter.

The element values of the J inverters are expressed as follows:

$$b_r = \frac{\omega_0}{2} \frac{dB_r(\omega)}{d\omega}\bigg|_{\omega=\omega_0} \quad \text{(Eq. 1)}$$

$$J_{01} = \sqrt{\frac{G_A b_1}{g_0 g_1} \cdot \frac{BW}{f_0}}, \quad J_{n,n+1} = \sqrt{\frac{G_A b_n}{g_n g_{n+1}} \cdot \frac{BW}{f_0}} \quad \text{(Eq. 2)}$$

$$J_{r,r+1} = \frac{BW}{f_0} \sqrt{\frac{b_r b_{r+1}}{g_r g_{r+1}}}, \quad r = 1, 2, \dots, (n-1) \quad \text{(Eq. 3)}$$

where n denotes the number of stages in the filter, $f_0$ denotes the center frequency of the attenuation region, BW denotes the pass-band width, $g_r$ denotes the element value of the prototype filter, $B_r(\omega)$ denotes the susceptibility of the resonator, and $G_A$ denotes the load conductance.

For parallel LC resonators, the susceptibility slope $b_r$ in Equation 1 can be expressed as follows:

$$b_r = \frac{\omega_0}{2} \frac{d\left(\omega C_r - \frac{1}{\omega L_r}\right)}{d\omega}\bigg|_{\omega=\omega_0} = \frac{\omega_0}{2}\left(C_r + \frac{1}{\omega_0 L_r}\right) = \omega_0 C_r \quad \text{(Eq. 4)}$$

where $C_r$ and $L_r$ denote the capacitance and inductance of the parallel resonator, respectively.

Figure 3A:
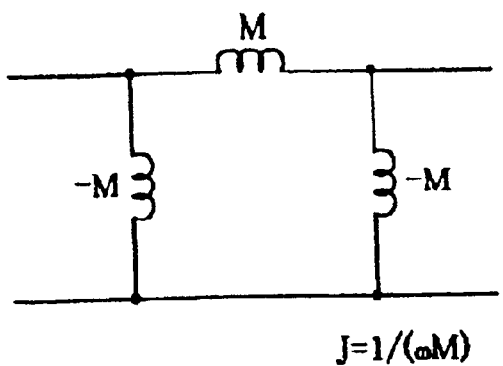
FIGS. 3A and 3B are circuit diagrams of a circuit including inductors and a circuit including capacitors, respectively, thereby implementing a J inverter circuit.
Figure 3B:
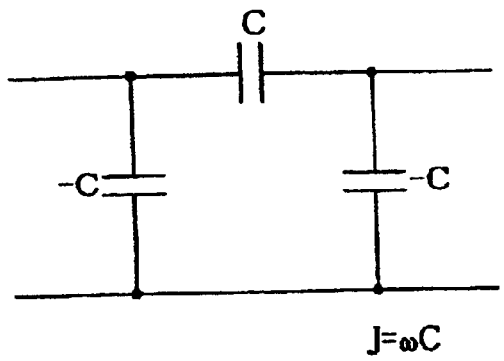

A circuit implementing the J inverter is shown in FIGS. 3A and 3B.

FIGS. 3A and 3B show circuits using inductors and capacitors implementing the J inverter, respectively.

With the design which provides inductive coupling between the resonators, the J inverter shown in FIG. 2 can be replaced with the circuit shown in FIG. 3A. With the design which provides capacitive coupling between the input/output unit and the resonators, the J inverter shown in FIG. 2 can be replaced with the circuit shown in FIG. 3B.

Figure 4:
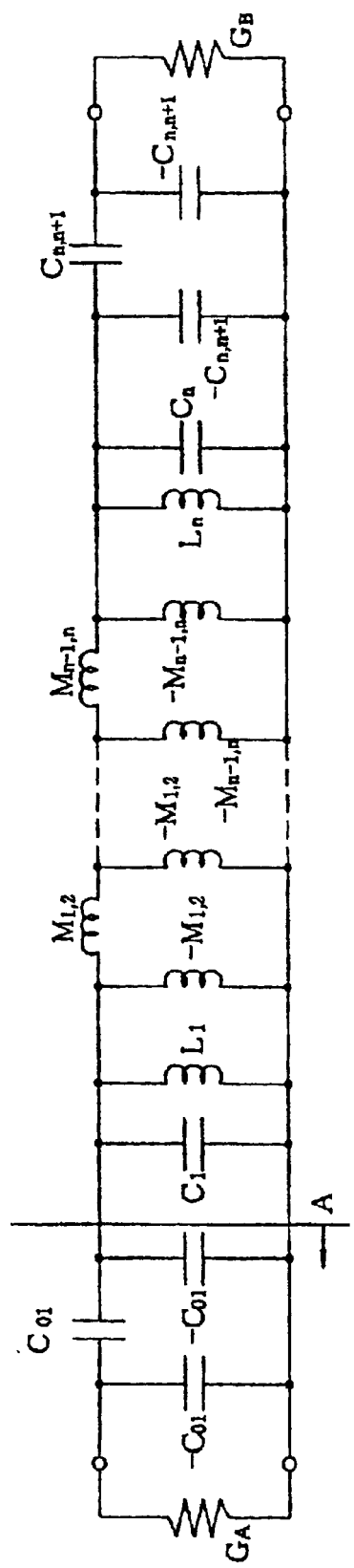
FIG. 4 is a circuit diagram of an n-stage band-pass filter in which the J inverter circuit is replaced with inductors and capacitors.

FIG. 4 is a circuit diagram after the replacement as described above with reference to FIGS. 3A and 3B.

The parallel capacitance $-C_{01}$ of the input/output unit is negative, and is not implemented unless changed. In order to make the impedance substantially equal at the input side as viewed from the line A in FIG. 4, the parallel capacitance $-C_{01}$ is replaced with serial capacitance $C'_{01}$ and parallel capacitance $C''_{01}$.

$$C'_{01} = \frac{1}{\omega_c} \frac{J_{01}}{\sqrt{\left(1 - \frac{J_{01}^2}{G_A^2}\right)}}, \quad C''_{01} = -\frac{J_{01}}{\omega_c}\sqrt{\left(1 - \frac{J_{01}^2}{G_A^2}\right)} \quad \text{(Eq. 5)}$$

In a first-stage resonator, the parallel capacitance $C''_{01}$ of the input/output unit can be combined with the parallel capacitance $C'_1$ defining a resonator. The parallel inductance $-M_{1,2}$ can be combined with the parallel inductance $L'_1$ defining a resonator.

Thus, the parallel capacitance $C'_1$ and the parallel inductance $L'_1$ are expressed as follows, thereby defining a two-stage filter:

$$C'_1 = C_1 - C''_{01}, \quad 1/L'_1 = 1/L_1 - 1/M_{1,2} \quad \text{(Eq. 6)}$$

From Equation 6, if $M_{1,2} < L_1$, then $L'_1 < 0$. Therefore, a filter cannot be constructed in effect. Accordingly, the relationship of $M_{1,2} > L_1$ must be satisfied, that is, the number of turns in a spiral inductor constituting a series element must be larger than the number of turns in a spiral inductor constituting a parallel element.

Figure 5:
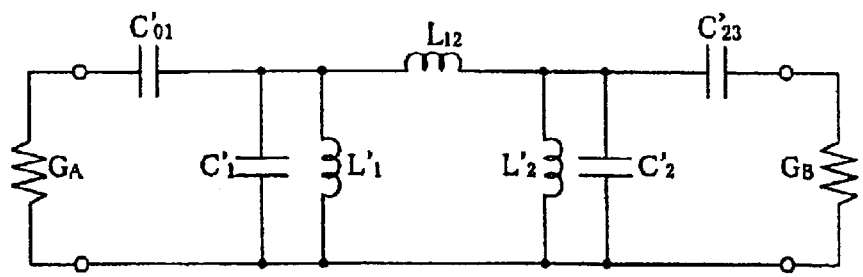
FIG. 5 is a circuit diagram of a band-pass filter having two parallel resonators which are inductively coupled with each other.

The replacement in this way allows the circuit shown in FIG. 4 to be converted into an equivalent circuit shown in FIG. 5.

FIG. 5 is a circuit diagram of a band-pass filter which provides inductive coupling between two parallel resonators.

The thus constructed band-pass filter would be more susceptible to the influence of inductors as the inductance increases, thus more strongly exhibiting the characteristic of a high-pass filter. Therefore, the attenuation characteristic is decreased at a high-frequency region of the pass band.

A capacitance, which is connected in parallel to the inductance connected between resonators, defines a resonator which is then inserted in series between the input and output units. The impedance at the center frequency of the resonator is set so as to be substantially equal to the impedance of the above-described inductance.

The self-resonance frequency of the resonator can be expressed as follows:

$$f_p = 1/(2\pi\sqrt{L'_{12}C_{12}}) \quad \text{(Eq. 7)}$$

where $f_p$ denotes the self-resonance frequency of the resonator.

By setting the resonance frequency of the serial resonator to be a predetermined frequency, the pass-band characteristic can be improved.

Thus, a lumped filter including two resonators, as shown in FIG. 1B, is constructed.

The characteristic of a spiral inductor is now described.

Figure 6:
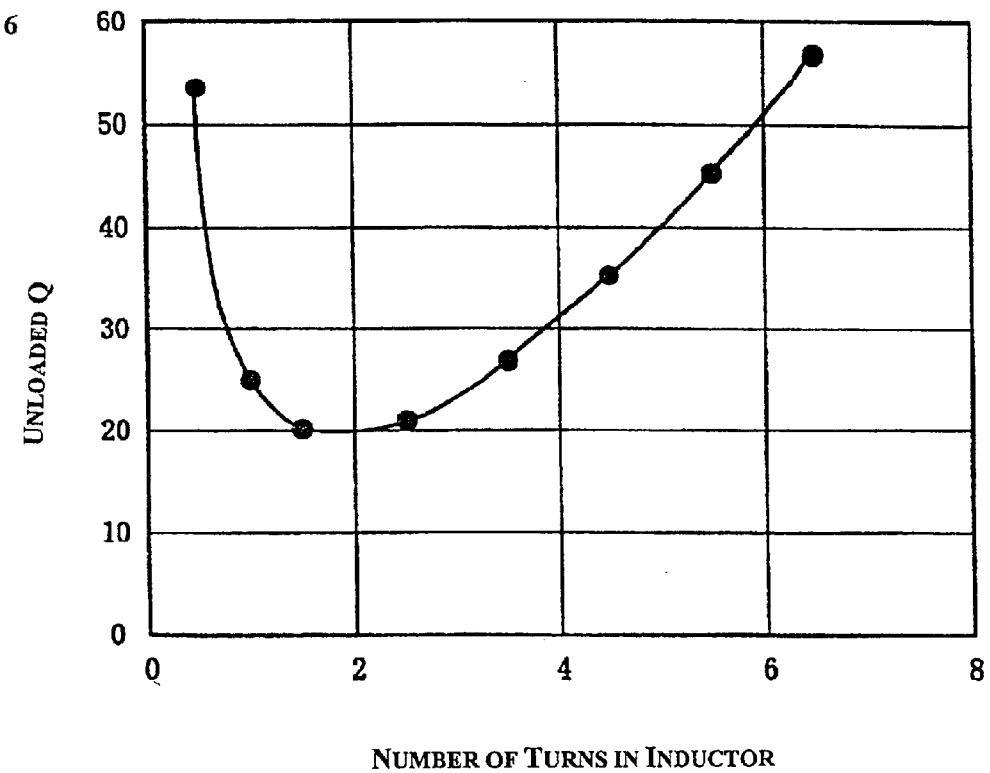
FIG. 6 is a graph showing a relationship between the number of turns in a spiral inductor and the unloaded Q.

FIG. 6 is a graph showing a relationship between the number of turns in a spiral inductor and unloaded Q.

In the example shown in FIG. 6, the test frequency is about 2 GHz, and the spiral inductor is disposed on an alumina substrate with the L/S ratio of about 20 $\mu$m to about 20 $\mu$m.

A relationship between the number of turns in the inductor and unloaded Q where this spiral inductor is used to construct a parallel LC resonator is shown in Table 1.

TABLE 1

| number of turns | area of inductor (mm$^2$) | unloaded Q of resonator |
| --- | --- | --- |
| 0.5 | 0.029 | 17.54 |
| 1.5 | 0.062 | 12.97 |
| 2.5 | 0.109 | 14.86 |
| 3.5 | 0.168 | 19.65 |
| 4.5 | 0.240 | 26.82 |
| 5.5 | 0.325 | 35.40 |

The calculation was effected where the area of the inductor is changed to change the capacitance as the number of turns in the inductor changes, while the resonance frequency is fixed at about 2 GHz.

As is apparent from the result of calculation, the unloaded Q of the resonator increases as the number of turns in the spiral inductor increases.

Although the unloaded Q of the resonator also increases in the region where the number of turns in the inductor is small, the stray capacitance between the lines in the spiral inductor is not taken in this region, thereby making it hard to implement.

A relationship between the number of turns in the spiral inductor, the inductance, and the stray capacitance, and a relationship between the number of turns in the spiral inductor and the self-resonance frequency are now described. A relationship between the line spacing in the spiral inductor, the inductance, and the stray capacitance, and a relationship between the line spacing in the spiral inductor and the self-resonance frequency are further described.

Figure 7A:
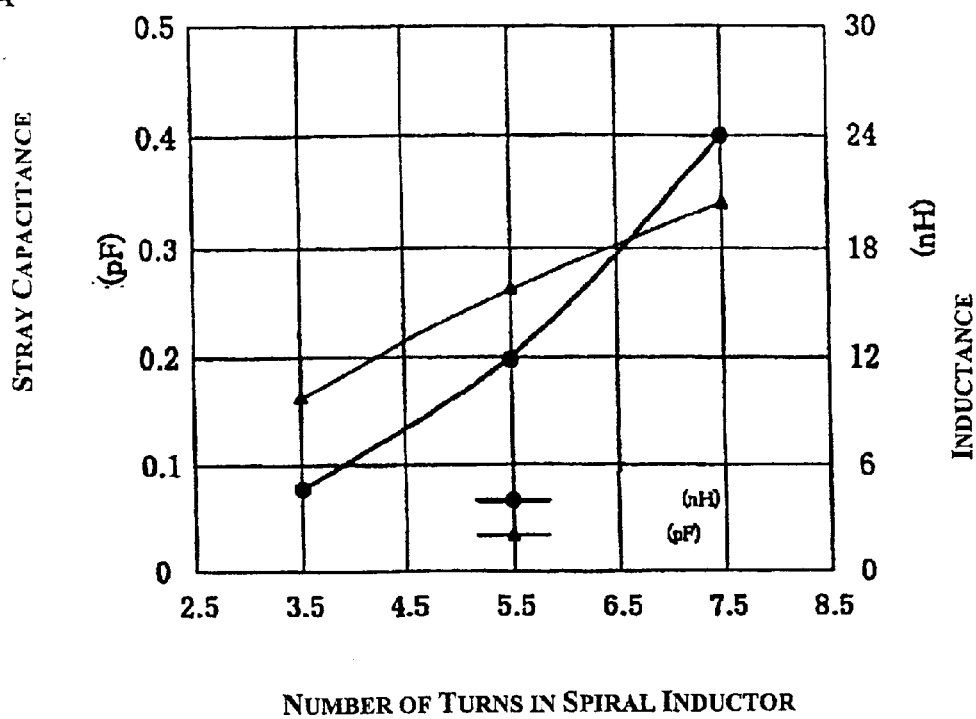
FIG. 7A is a graph showing a relationship between the number of turns in the spiral inductor, the stray capacitance, and the inductance.
Figure 7B:
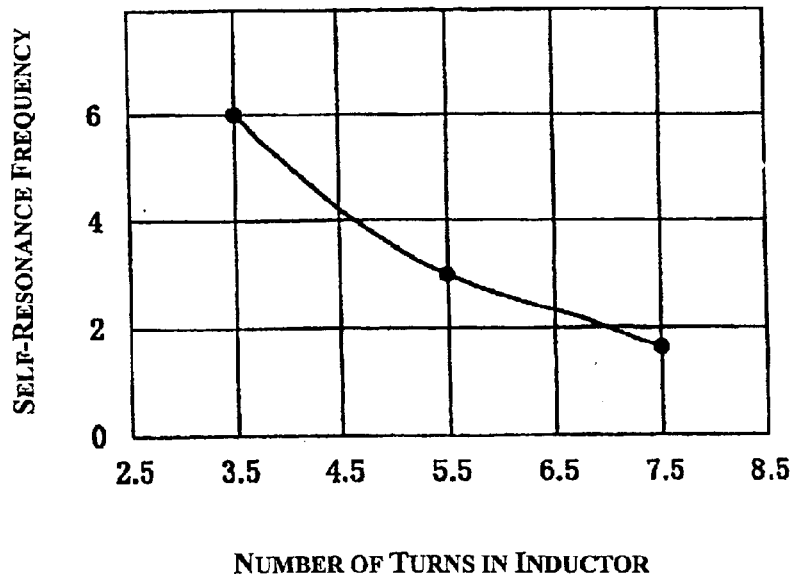
FIG. 7B is a graph showing a relationship between the number of turns in the spiral inductor and the self-resonance frequency.

FIG. 7A shows a relationship between the number of turns in the spiral inductor, the inductance, and the stray capacitance, and FIG. 7B shows a relationship between the number of turns in the spiral inductor and the self-resonance frequency. The L/S ratio of the spiral inductor is about 20 $\mu$m to about 20 $\mu$m regardless of the number of turns.

Figure 8A:
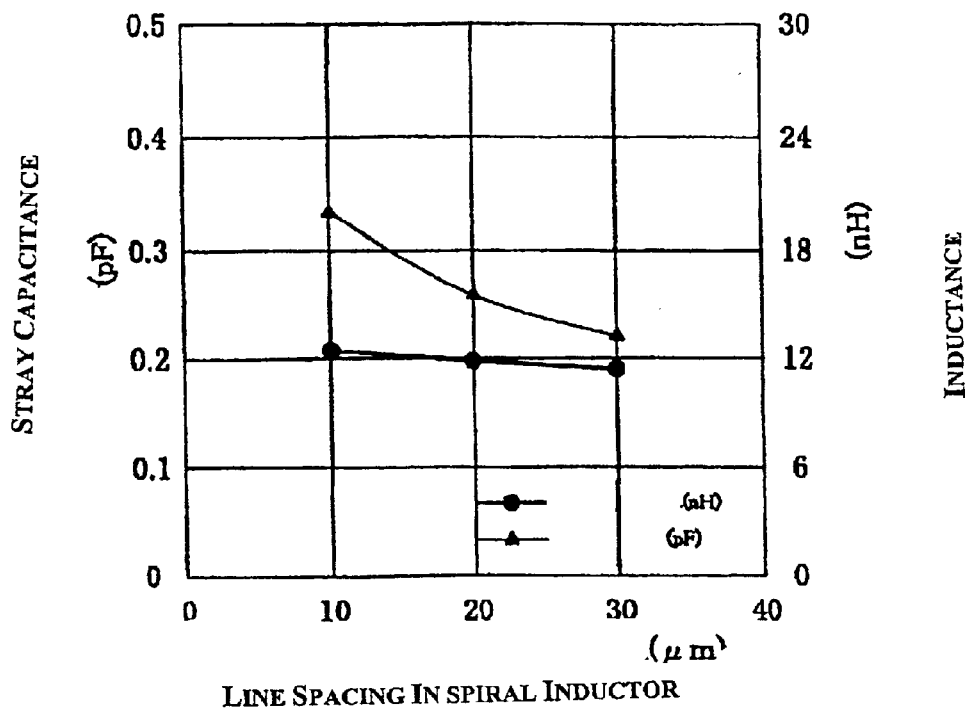
FIG. 8A is a graph showing a relationship between the line spacing in a spiral inductor, the stray capacitance, and the inductance.
Figure 8B:
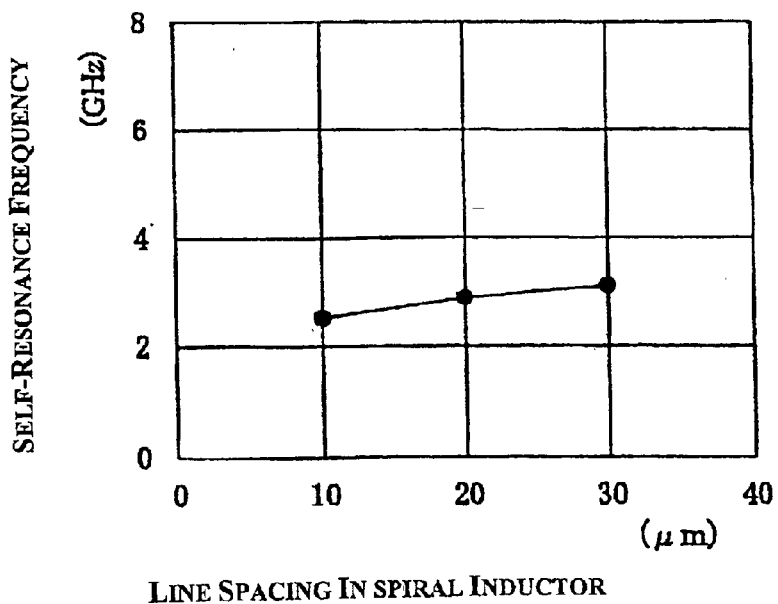
FIG. 8B is a graph showing a relationship between the line spacing in a spiral inductor and the self-resonance frequency.

FIG. 8A shows a relationship between the line spacing in the spiral inductor, the inductance, and the stray capacitance, and FIG. 8B shows a relationship between the line spacing in the spiral inductor and the self-resonance frequency. The line width in the spiral inductor is preferably about 20 $\mu$m.

As shown in FIGS. 7A and 7B, if the L/S ratio is constant, the stray capacitance and the inductance increase as the number of turns in the spiral inductor increases. Therefore, the self-resonance frequency of the spiral inductor is changed.

As shown in FIGS. 8A and 8B, if the line width is constant at about 20 μm, the stray capacitance and the inductance increase as the line spacing increases. Therefore, the self-resonance frequency of the spiral inductor is changed.

Accordingly, by changing the number of turns in the spiral inductor and the L/S ratio, the self-resonance frequency of the spiral inductor can be changed as desired.

The spiral inductor is used as a series element in the foregoing filter, and the L/S ratio is determined, thereby determining the attenuation pole frequency.

Figure 9:
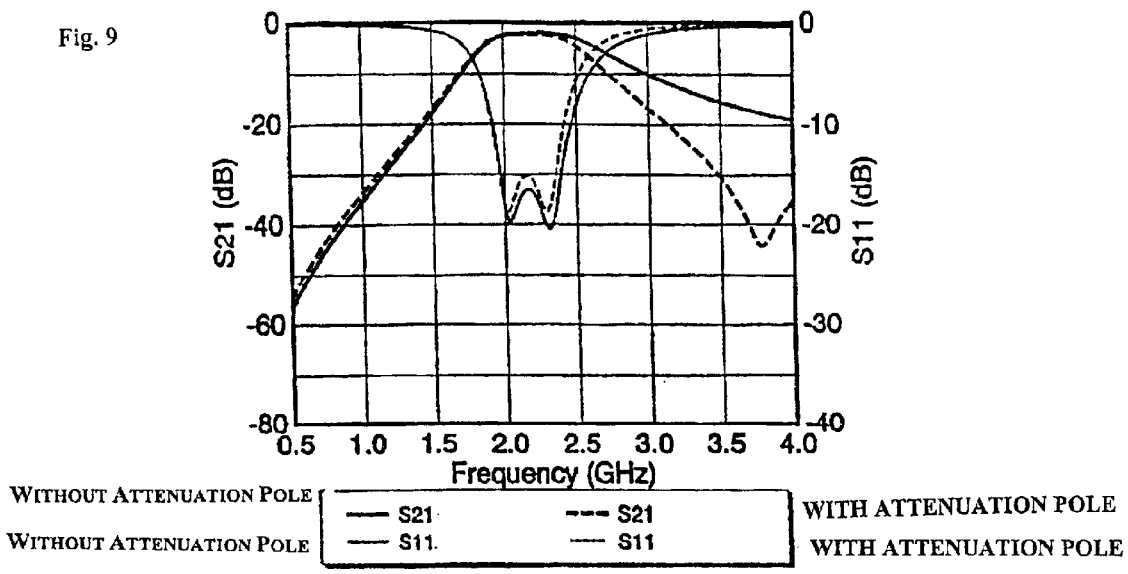
FIG. 9 is a graph showing a simulation result of the frequency characteristic of the band-pass filter.
Figure 10:
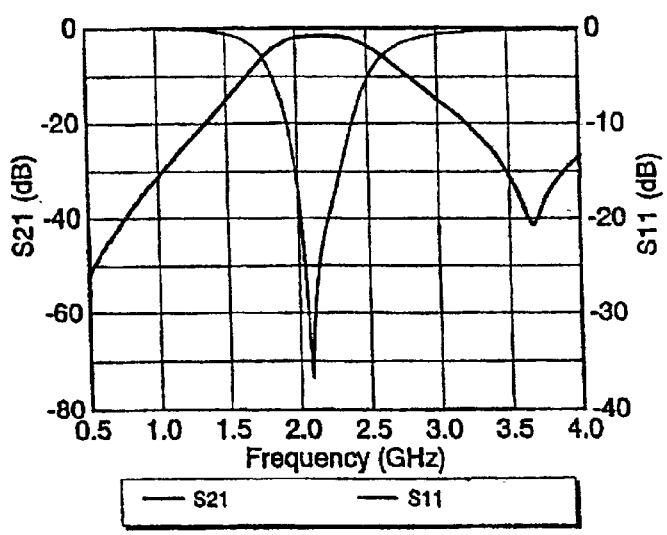
FIG. 10 is a graph showing the result of observation of the frequency characteristic of the band-pass filter.

The frequency characteristic of a two-stage band-pass filter which is designed and constructed in the above-noted way to achieve a desired characteristic is shown in FIGS. 9 and 10.

FIG. 9 shows a simulation result of the frequency characteristic of the band-pass filter, and FIG. 10 shows a result of observation of the frequency characteristic of the filter according to preferred embodiments of the present invention.

In FIG. 9, a solid line indicates the response curve of a filter including a series element that includes capacitance, and a broken line indicates the response curve of a filter including a series element that includes a parallel LC resonator.

As shown in FIG. 9, the filter including a series element that has capacitance exhibits a smooth response curve at a high-frequency region of the pass band, and prevents attenuation of the signal in the high-frequency region, thus exhibiting the high-pass characteristic. On the other hand, the filter including a series element that includes a parallel LC resonator produces an attenuation pole at a high-frequency region of the pass band, and increases the amount of attenuation at a high-frequency region, thereby increasing the frequency characteristic of the band-pass filter.

The attenuation pole is determined by the self-resonance frequency of the parallel LC resonator which is a series element. Thus, by determining the number of turns in the spiral inductor constituting a parallel LC resonator and the L/S ratio so as to achieve a desired self-resonance frequency, the position of the attenuation pole can be changed to control the pass-band characteristic.

Therefore, a band-pass filter having a high response with fewer circuit elements can be achieved.

Since MIM capacitors are preferably used for capacitors in the input and output units, the area occupied by the capacitors can be reduced. Therefore, the overall filter can be simple and useful for saving space.

Although an attenuation pole is formed at a high-frequency region of the pass band in the first preferred embodiment, the stray capacitance of the spiral inductor which is a series element may increase, thereby producing an attenuation pole at a low-frequency region of the pass band. Thus, the response at a low-frequency region can be greatly improved.

Although MIM capacitors are preferably used for capacitors in the input and output units in the first preferred embodiment, interdigital capacitors may also be used. Alternatively, the J inverter in the input and output units may be converted into an inductor circuit, in which a spiral inductor is used as an inductor.

While a substantially rectangular spiral inductor is preferably used in the first preferred embodiment, instead, a substantially circular spiral inductor may also be used.

The upper and lower electrodes may preferably be made of an oxide superconductor, such as $YB_2Cu_3O_{7-x}$, and the dielectric ceramic substrate and the dielectric film may be constituted by a substrate, such as MgO, having a low dielectric loss, thereby constructing a lumped filter incorporating a superconductor. Such a lumped filter may be used in an environment of the transition temperature or lower, thereby eliminating the conductor loss of the electrodes and significantly reducing the insertion loss of the lumped filter. The elimination of conductor loss leads to a compact spiral inductor, and therefore a compact lumped filter.

A shared antenna unit according to a second preferred embodiment of the present invention is now described with reference to FIG. 11.

Figure 11:
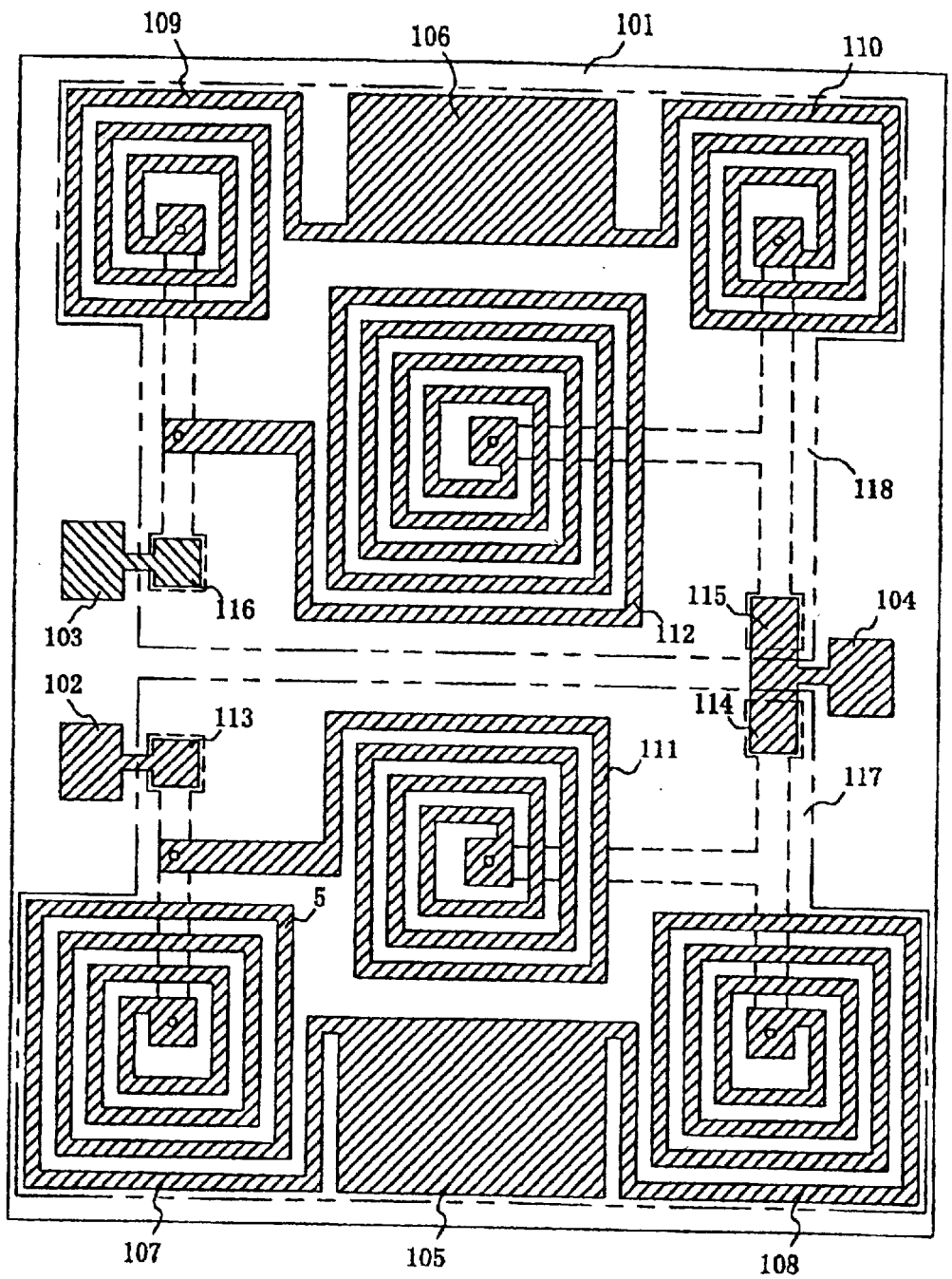
FIG. 11 is a plan view of a shared antenna unit according to a second preferred embodiment of the present invention.

FIG. 11 is a plan view of the shared antenna unit.

FIG. 11 illustrates an alumina substrate 101, a Tx terminal 102, an Rx terminal 103, an antenna terminal 104, ground electrodes 105 and 106, spiral inductors 107 to 112, MIM capacitors 113 to 116, and filter circuits 117 and 118. A lower electrode, a dielectric film, and an upper electrode are laminated one upon another on the alumina substrate 101. In FIG. 11, the upper electrode is shown as being shaded and surrounded by solid lines, and the lower electrode is shown as being surrounded by broken lines.

The shared antenna unit shown in FIG. 11 includes the two filters 117 and 118, the antenna terminal 104 connected to the two filters 117 and 118, the TX terminal 102 connected to the filter 117, and the RX terminal 103 connected to the filter 118. The antenna terminal 104, the TX terminal 102, and the RX terminal 103 are disposed on the upper electrode.

The number of turns, line width, and line spacing in each spiral inductor in the filters 117 and 118 are determined so as to achieve a desired characteristic. Other structures are preferably the same or similar to those in the filter according to the first preferred embodiment of the present invention.

The signal input from the TX terminal 102 has an unwanted frequency component removed by the TX filter 117, and is then delivered from the antenna via the antenna terminal 104. On the other hand, the signal which has been received by the antenna and input from the antenna terminal 104 has an unwanted frequency component removed by the RX filter 118, and is then transmitted to an external circuit via the RX terminal 103. Thus, a shared antenna unit having both TX and RX functions is constructed using a single circuit network.

The number of turns in the spiral inductors 107 and 108, constituting two resonators, which are connected in parallel in the TX filter 117 is preferably larger than the number of turns in the spiral inductors 109 and 110 in the RX filter 118. Thus, the center frequency of the pass band of the TX filter 117 is lower than that of the RX filter 118.

The spiral inductor 111 which is a series element in the TX filter 117 preferably has a smaller number of turns so that its inductance is low, thereby producing an attenuation pole at a high-frequency region of the pass band and providing a sharper attenuation curve at a high-frequency region of the pass band. The spiral inductor 112 which is a series element in the RX filter 118 preferably has a larger number of turns so that its stray capacitance is high, thereby producing an attenuation pole at a low-frequency region of the pass band and providing a sharper attenuation curve at a low-frequency region of the pass band.

Figure 12:
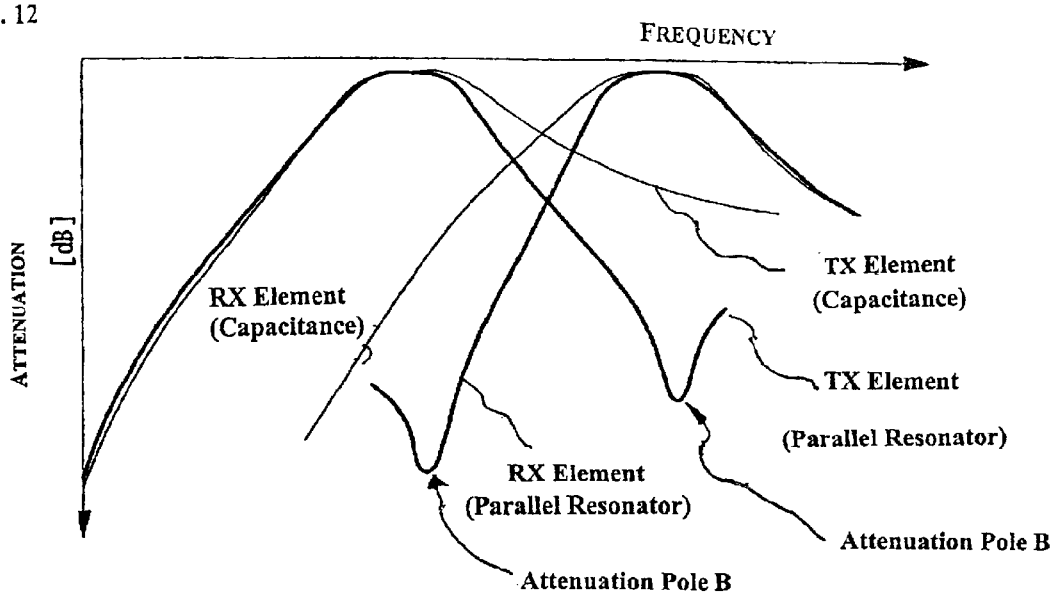
FIG. 12 is a frequency characteristic chart of the shared antenna unit.

FIG. 12 is a frequency characteristic chart of the shared antenna unit.

In FIG. 12, a thin line indicates the case where the series element includes capacitance, and a bold line indicates the case where the series element includes a parallel LC resonator.

As shown in FIG. 12, the pass band of the TX filter 117 and the pass band of the RX filter 118 are adjacent so that the pass band of the TX filter 117 is lower than the pass band of the RX filter 118. The TX filter 117 exhibits a sharp attenuation characteristic at a high-frequency region since an attenuation pole A exists in a high-frequency region of the pass band, thus sufficiently attenuating the signal of the RX side. The RX filter 118, conversely, exhibits a sharp attenuation characteristic at a low-frequency region since an attenuation pole B exists at a low-frequency region of the pass band, thus sufficiently attenuating the signal of the TX side.

Therefore, a shared antenna unit having a TX filter and an RX filter and capable of sufficiently attenuating the frequency components in the mutual pass bands can be achieved.

Since the resonators in the filters include spiral inductors, the shared antenna unit can be simple.

A communication device according to a third preferred embodiment of the present invention is now described with reference to FIG. 13.

Figure 13:
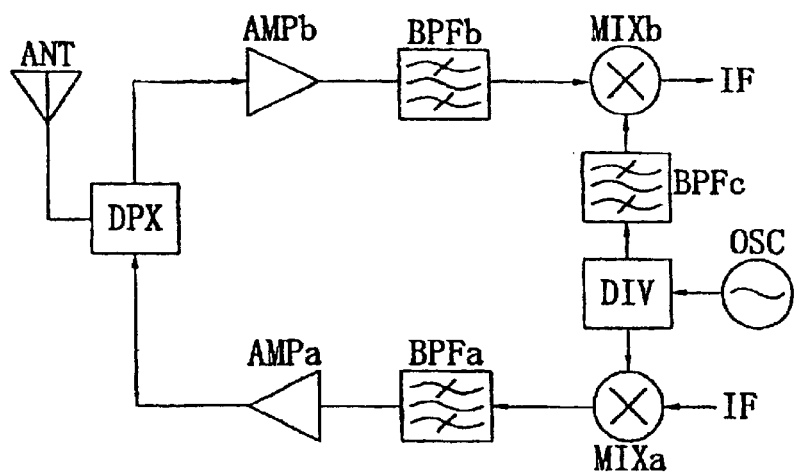
FIG. 13 is a block diagram of a communication device according to a third preferred embodiment of the present invention.
Figure 14A:
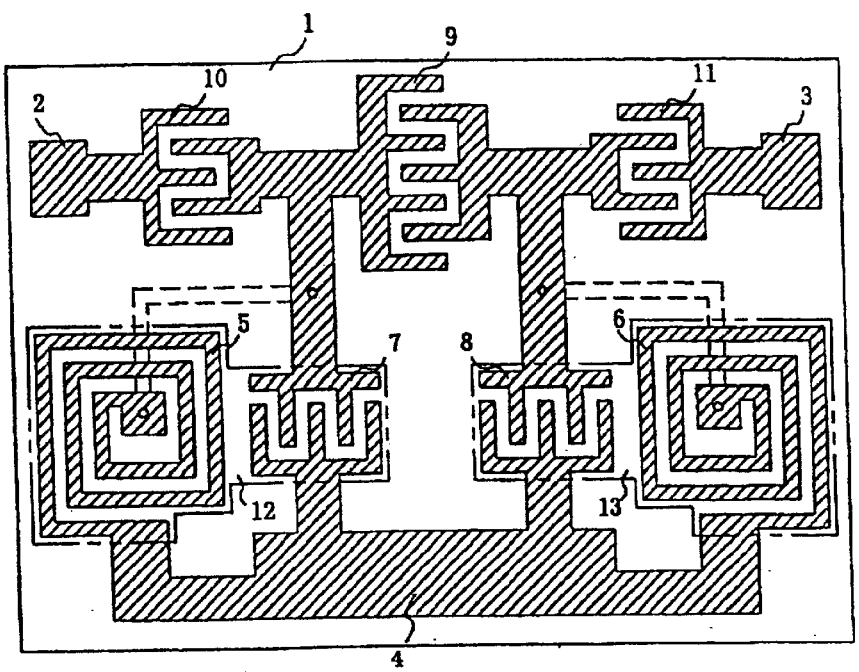
FIGS. 14A and 14B are a plan view and an equivalent circuit diagram of a typical lumped filter, respectively.
Figure 14B:
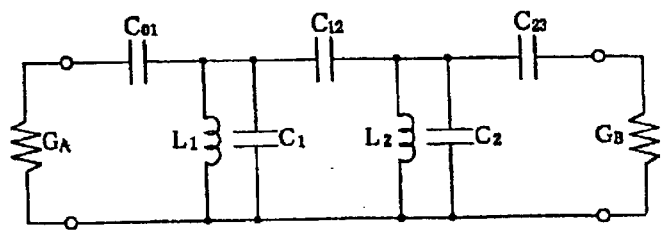

FIG. 13 is a block diagram of the communication device.

FIG. 13 illustrates a transmission/reception antenna ANT, a duplexer DPX, band-pass filters BPFa, BPFb, and BPFc, amplifier circuits AMPa and AMPb, mixers MIXa and MIXb, an oscillator OSC, and a divider (synthesizer) DIV. The mixer MIXa modulates a frequency signal output from the divider DIV with an IF signal. The band-pass filter BPFa only passes components in the transmission frequency band therethrough, and the amplifier circuit AMPa amplifies the components, and then outputs them from the transmission/reception antenna ANT via the duplexer DPX. The amplifier circuit AMPb amplifies the signal output from the duplexer DPX. The band-pass filter BPFb only passes components in the reception frequency band from the output signal from the amplifier circuit AMPb therethrough. The mixer MIXb mixes the frequency signal output from the band-pass filter BPFc with the received signal to output an intermediate frequency signal IF.

The band-pass filters BPFa, BPFb, and BPFc may be implemented as lumped filters having the structure shown in FIG. 1. The duplexer DPX may be implemented as a shared antenna unit having the structure shown in FIG. 11. Thus, a simple communication device having a high communication characteristic can be achieved.

While the present invention has been described with reference to what are at present considered to be preferred embodiments, it is to be understood that various changes and modifications may be made thereto without departing from the invention in its broader aspects and therefore, it is intended that the appended claims cover all such changes and modifications that fall within the true spirit and scope of the invention.

What is claimed is:

1. A lumped filter comprising:

a substrate including a plurality of inductors having spiral electrodes, a plurality of capacitors, an input terminal, an output terminal, and a ground electrode, which are arranged to define a circuit on said substrate;

a plurality of parallel elements connected between the input terminal and the ground electrode, and between the output terminal and the around electrode, the plurality of parallel elements include parallel LC resonators each being defined by an inductance generated by one of the spiral electrodes and a capacitance produced between adjacent turns of the spiral electrodes; and a plurality of series elements inserted between the plurality of parallel elements, the plurality of series elements include a parallel LC resonators being defined by an inductance generated by one of the spiral electrodes and a capacitance produced between adjacent turns of the spiral electrodes; wherein the number of turns in the spiral electrodes of the plurality of the series elements is greater than the number of turns in the spiral electrodes of the parallel elements adjacent to the series element.

2. A lumped filter according to claim 1, wherein the capacitors are metal-insulator-metal capacitors.

3. A lumped filter according to claim 1, wherein each of the spiral electrodes of the inductors has at least 3 turns.

4. A lumped filter according to claim 1, wherein the substrate is a dielectric ceramic substrate.

5. A lumped filter according to claim 1, wherein the substrate includes an alumina substrate and a dielectric film disposed on the alumina substrate.

6. A lumped filter according to claim 1, wherein the inductors are spiral inductors each having a line-to-space ratio of about 20 $\mu$m to about 20 $\mu$m.

7. A lumped filter according to claim 1, wherein the capacitors are interdigital capacitors.

8. A lumped filter according to claim 1, wherein the inductors are one of substantially rectangular spiral inductors and substantially circular spiral inductors.

9. A lumped filter according to claim 1, wherein the number of turns in the spiral electrodes included in the plurality of series elements is set at a predetermined value to determine the frequency of an attenuation pole produced by the self-resonance of the parallel LC resonator.

10. A lumped filter according to claim 1, wherein the line width and line spacing in the spiral electrodes of the plurality of series elements are set at predetermined values to determine the frequency of an attenuation pole produced by the self-resonance of the parallel LC resonator.

11. A communication device comprising the lumped filter according to claim 1.

12. A lumped filter according to claim 1, wherein at least one of the plurality of series elements is inserted between the input terminal and the plurality of parallel elements, and between the output terminal and the plurality of parallel elements, and includes a capacitor having a lower electrode, a dielectric film, and an upper electrode disposed on top of each other on the dielectric ceramic substrate.

13. A lumped filter according to claim 1, wherein each of the spiral electrodes includes a thin film having superconductivity.

14. A shared antenna unit comprising the lumped filter according to claim 1.

* * * * *